United States Patent
Liu (12)

(10) Patent No.: US 6,452,803 B1
(45) Date of Patent: Sep. 17, 2002

(54) HEAT SINK ASSEMBLY

(75) Inventor: Herben Liu, Shenzhen (CN)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/909,924

(22) Filed: Jul. 20, 2001

(51) Int. Cl.⁷ .............................................. H05K 7/20
(52) U.S. Cl. ...................... 361/704; 361/695; 361/703; 257/718; 257/719; 257/727; 165/80.3; 174/16.3
(58) Field of Search ................................ 361/690, 695, 361/703, 704, 717–719; 257/718, 719, 727; 174/16.3; 165/80.3, 185; 24/458

(56) References Cited

U.S. PATENT DOCUMENTS

| | | | | |
|---|---|---|---|---|
| 4,745,456 A | * | 5/1988 | Clemens | 257/718 |
| 5,677,829 A | * | 10/1997 | Clemens | 361/697 |
| 6,075,699 A | * | 6/2000 | Rife | 361/704 |
| 6,293,331 B1 | * | 9/2001 | Wang | 165/80.3 |

* cited by examiner

Primary Examiner—Boris Chervinsky
(74) Attorney, Agent, or Firm—Wei Te Chung

(57) ABSTRACT

A heat sink assembly includes a heat sink (10), and a clip (30). The heat sink includes a base (12) defining an annular groove (14), and a plurality of upwardly extending fins (16). A cavity (18) defined in the fins accommodates a fan (20). The clip includes a generally annular body (32), a first arm (34) pivotably attached to the body, and a second arm (42) fixedly attached to the body. The body defines a cutout (36) for facilitating elastic deformation thereof. The body further defines a pair of apertures (40), and the first arm forms a pair of projections (46). The first arm is rotated and the body is squeezed so that the projections are engaged in the apertures. The body is thereby securely received in the groove and engaged with the base. When the projections are disengaged from the apertures, the body is disengagable from the base.

17 Claims, 3 Drawing Sheets

HEAT SINK ASSEMBLY

BACKGROUND OF THE INVENTION

1. Field of the Invention

The present invention relates to heat sink assemblies for electronic devices, and particularly to heat sink assemblies which have a clip readily and securely attaching a heat sink to an electronic device.

2. Related Art

Computer electronic devices such as central processing units (CPUs) frequently generate large amounts of heat, which can destabilize operation and cause damage. A heat sink placed in thermal contact with an electronic device mounted on a socket transfers heat from the electronic device through conduction. Oftentimes, the heat sink is secured to the electronic device with a clip.

A conventional heat sink has a channel defined in an upper portion thereof. An elongate clip is accommodated in the channel, and engages with an electronic device to thereby attach the heat sink to the electronic device. Unfortunately, the channel occupies space which would otherwise be occupied by heat-dissipating fins of the heat sink. The channel thus effectively reduces the heat dissipating surface area of the heat sink, and therefore decreases the heat dissipating efficiency of the heat sink.

Another kind of conventional heat sink, as disclosed in Taiwan Patent Application No. 83204483, forms a plurality of threads on a bottom portion thereof. A clip frame threadingly engages with the threads of the heat sink. The frame is then clipped onto the electronic device, and thereby attaches the heat sink to the electronic device. Unfortunately, forming matching threads on the heat sink and the clip requires unduly precise manufacturing engineering. Furthermore, when the assembly is subjected to vibration during normal use, contact between the heat sink and the electronic device is prone to loosen.

SUMMARY OF THE INVENTION

Accordingly, an object of the present invention is to provide a heat sink assembly which has a clip readily and securely attaching a heat sink to an electronic device.

To achieve the above-mentioned object, a heat sink assembly in accordance with the present invention comprises a heat sink and a clip. The heat sink comprises a base defining a groove in a circumferential surface thereof, and a plurality of upwardly extending fins. A cavity is defined in a middle portion of the fins, for accommodating a fan therein. The clip comprises a generally annular body, a first arm pivotably attached to the body, and a second arm fixedly attached to the body. The body defines a cutout therethrough, for facilitating elastic deformation of the body. The body further defines a pair of apertures, and the first arm forms a pair of projections corresponding to the apertures. The first arm is rotated and the body is squeezed so that the projections are engaged in the apertures. The body is thereby securely received in the groove and engaged with the base. When the projections are disengaged from the apertures, the body is disengagable from the base.

Other objects, advantages and novel features of the present invention will be drawn from the following detailed embodiment of the present invention with attached drawings, in which:

DESCRIPTION OF THE PREFERRED EMBODIMENT

Figure 1:
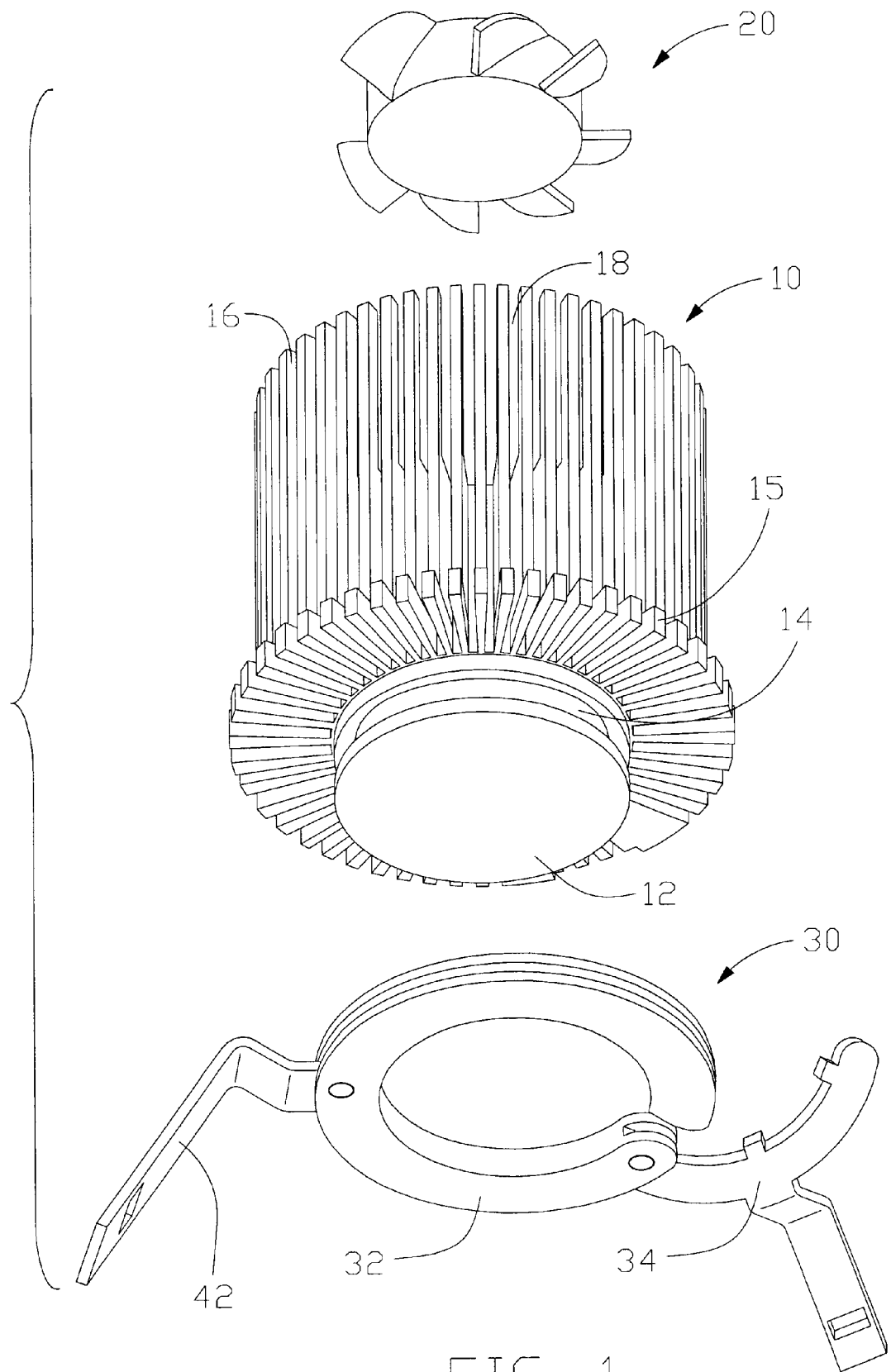
FIG. 1 is an exploded view of a heat sink assembly of the present invention.

Referring to the attached drawings, FIG. 1 is an exploded view showing a heat sink assembly of the present invention. The heat sink assembly comprises a heat sink 10, an electrical fan 20, and a clip 30 attaching the heat sink 10 to an electronic device (not shown).

The heat sink 10 is generally cylindrical. The heat sink 10 comprises a generally coin-shaped base 12 for contacting the electronic device to transfer heat therefrom, and a plurality of upwardly extending fins 16 in radial formation for dissipating heat. An annular groove 14 is defined in a central portion of a circumferential surface of the base 12. A plurality of protrusions 15 extends horizontally outwardly from bottom portions of the fins 16 respectively, for increasing the heat dissipating surface area of the heat sink 10. A cavity 18 is defined in a top portion of the heat sink 10, in a center of the formation of fins 16.

The fan 20 is accommodated in the cavity 18 of the heat sink 10.

Figure 2:
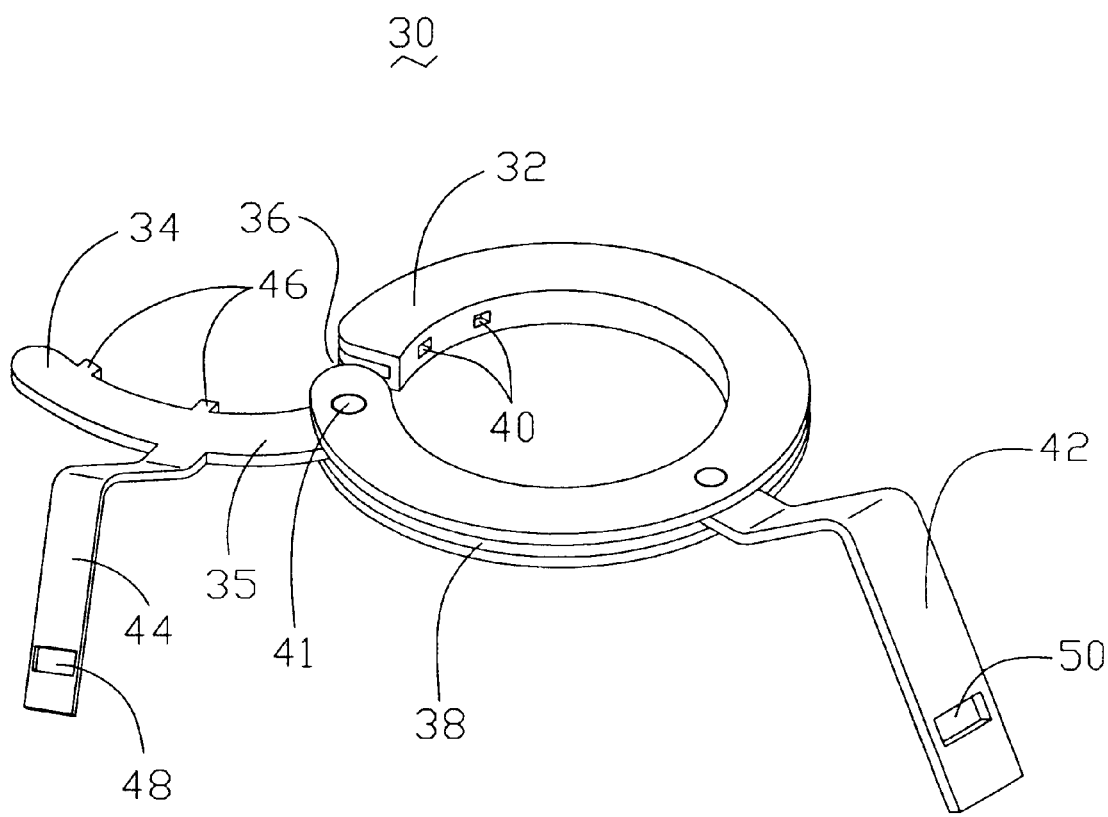
FIG. 2 is a perspective view of a clip of FIG. 1, but viewed from a reverse aspect.

Referring also to FIG. 2, the clip 30 comprises a generally annular body 32, a first arm 34 and a second arm 42. An internal diameter of the body 32 is slightly larger than an external diameter of the base 12 of the heat sink 10. A cutout 36 is defined through the body 32 along a radius thereof, for facilitating elastic deformation of the body 32. The cutout 36 crosses from an external surface of the body 32 to an internal surface thereof. An annular channel 38 is defined in a central portion of an external circumferential surface of the body 32. A pair of horizontally-spaced apertures 40 is defined in the internal surface of the body 32. The apertures 40 are located at one side of the cutout 36, and are in communication with the channel 38. A pair of coaxial pivot holes (not labeled) is respectively defined in a top and a bottom surface of the body 32. The pivot holes are located at an opposite side of the cutout 36, and are in communication with the channel 38.

The first arm 34 comprises an arcuate connect portion 35, and a locking portion 44 extending from a convex edge of the connect portion 35. A pivot hole (not shown) is defined through one end of the connect portion 35. A pair of projections 46 is formed on a concave edge of the connect portion 35, corresponding to the apertures 40 of the body 32. A first locking opening 48 is defined near a bottom of the locking portion 44, for effecting engagement of the locking portion 44 with the electronic device. The end of the connect portion 35 defining the pivot hole is accommodated in the channel 38 of the body 32, between the pivot holes (not labeled) of the body 32. A pivot axle 41 is movably accommodated in the pivot hole of the first arm 34 and the pivot holes of the body 32, such that the first arm 34 is pivotably attached to the body 32.

The second arm 42 is fixedly attached to the body 32 by fastening means such as a rivet. The second arm 42 generally opposes the apertures 40. A second locking opening 50 is defined near a bottom of the second arm 42, for effecting engagement of the second arm 42 with the electronic device.

Figure 3:
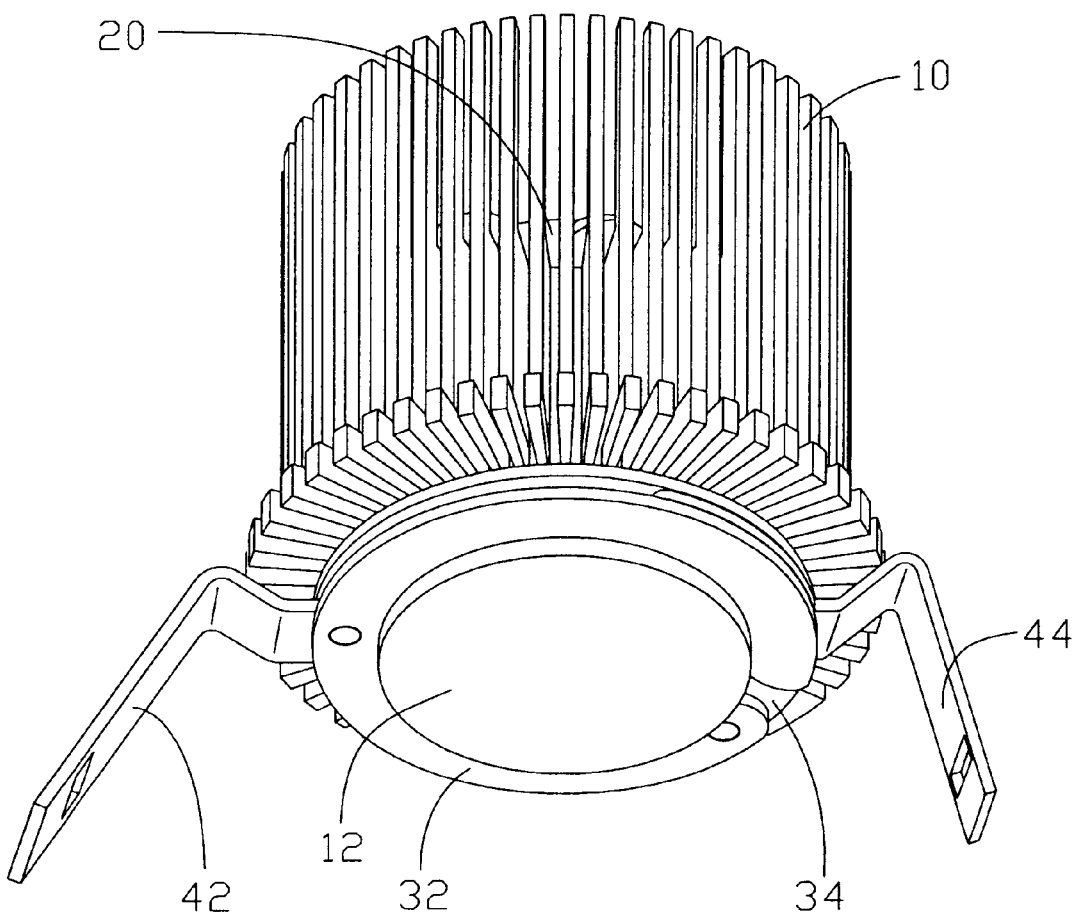
FIG. 3 is an assembled view of FIG. 1.

Referring also to FIG. 3, in assembly, the body 32 of the clip 30 is loosely received in the groove 14 of the heat sink 10. The first arm 34 is pivoted about the pivot axle 41 toward the body 32, and simultaneously the body 32 is manually squeezed. The body 32 is thereby elastically deformed, with its internal diameter being reduced. The projections 46 of the first arm 34 are received in the apertures 40 of the body 32. The body 32 is thereby securely received in the groove 14 and engaged with the base 12 of the heat sink 10. At this position, the external diameter of the base 12 is greater than the internal diameter of the body 32. The fan 20 is then accommodated in the cavity 18 of the heat sink 10 by conventional means. The heat sink assembly is thus assembled. In use, the heat sink assembly is placed on the electronic device. The clip 30 is resiliently engaged with the electronic device, with the first and second locking openings 48, 50 of the clip 30 engagingly receiving the electronic device. The heat sink assembly is thus securely attached to the electronic device.

It is understood that the invention may be embodied in other forms without departing from the spirit thereof. Thus, the present example and embodiment is to be considered in all respects as illustrative and not restrictive, and the invention is not to be limited to the details given herein.

I claim:

1. A heat sink assembly comprising:
   a heat sink having a base adapted to contact an electronic device for transferring heat therefrom and a plurality of upwardly extending fins adapted to dissipate heat, the base defining a groove; and
   a clip adapted to attach the heat sink to an electronic device, the clip comprising a body securely received in the groove, a first arm pivotably attached to the body, and a second arm fixedly attached to the body, the first arm forming at least one projection and the body defining at least one aperture receiving the at least one projection;
   wherein
      the groove is annular and defined in a circumferential surface of the base.

2. The heat sink assembly as claimed in claim 1, wherein the body defines a cutout extending from an external surface to an internal surface thereof, for facilitating elastic deformation of the body.

3. The heat sink assembly as claimed in claim 1, wherein the base is generally coin-shaped and the body is annular, and wherein when the at least one projection is engaged in the at least one aperture an external diameter of the base is larger than an internal diameter of the body, and when the at least one projection is disengaged from the at least one aperture the external diameter of the base is smaller than the internal diameter of the body.

4. The heat sink assembly as claimed in claim 1, wherein the body defines an annular channel in an external circumferential surface thereof, and the at least one aperture is in communication with the channel.

5. The heat sink assembly as claimed in claim 4, wherein the first arm comprises an arcuate connect portion and a locking portion extending from an edge of the connect portion, the at least one projection being formed on an opposite edge of the connect portion, one end of the connect portion being accommodated in the channel.

6. The heat sink assembly as claimed in claim 5, wherein the body defines a pair of coaxial pivot holes in communication with the channel, the said one end of the connect portion defines a pivot hole, and a pivot axle is movably accommodated in the pivot hole of the first arm and the pivot holes of the body such that the first arm is pivotably attached to the body.

7. The heat sink assembly as claimed in claim 1, wherein the first arm defines a first locking opening and the second arm defines a second locking opening, the first and second locking openings being adapted for effecting engagement of the clip with the electronic device.

8. The heat sink assembly as claimed in claim 1, wherein the heat sink assembly further comprises a fan received in a cavity defined in the fins of the heat sink.

9. The heat sink assembly as claimed in claim 1, wherein a plurality of protrusions extends horizontally outwardly from bottom portions of the fins respectively, for increasing the heat dissipating surface area of the heat sink.

10. A heat sink assembly comprising:
    a heat sink comprising a base defining a groove in a circumferential surface thereof, and a plurality of fins extending upwardly from the base; and
    a clip comprising a body received in the groove, a first arm pivotably attached on one side of the body, and a second arm fixedly attaching on an opposite side of the body, the first arm forming at least one projection and the body defining at least one aperture,
    wherein when the at least one projection is engaged in the at least one aperture the body is securely received in the groove and thereby engaged with the base, and when the at least one projection is disengaged from the at least one aperture the body is disengagable from the base.

11. The heat sink assembly as claimed in claim 6, wherein the body defines a cutout extending from an external surface to an internal surface thereof, for facilitating elastic deformation of the body.

12. A heat sink assembly comprising:
    a heat sink having a base adapted for engaging with an electronic device and a plurality of fins extending upwardly from the base; and
    a clip comprising a body engaging in a circumferential periphery of the base, a first arm pivotably attached to the body and having an engaging element engaging with the body, and a second arm fixedly attached to the body, the first and second arms being adapted for effecting engagement of the base of the heat sink with the electronic device.

13. The heat sink assembly as claimed in claim 12, wherein the body defines a cutout therethrough to thereby form two ends of the body, the first arm is pivotally attached to the body at one of the ends, and the engaging element of the first arm engages with the body at the other end.

14. The heat sink assembly as claimed in claim 13, wherein the engaging element of the first arm comprises at least one projection formed on the first arm, the at least one projection fittingly engaging in at least one aperture defined in the body.

15. The heat sink assembly as claimed in claim 14, wherein the base of the heat sink is generally coin-shaped.

16. The heat sink assembly as claimed in claim 15, wherein each of the first and second arms defines an opening adapted for effecting engagement between the base of the heat sink and the electronic device.

17. The heat sink assembly as claimed in claim 16 further comprises an electrical fan received in the fins of the heat sink.

* * * * *